United States Patent [19]
Yokogawa et al.

[11] Patent Number: 4,866,489
[45] Date of Patent: Sep. 12, 1989

[54] SEMICONDUCTOR DEVICE

[75] Inventors: Toshiya Yokogawa, Nara; Mototsugu Ogura, Takaichi, both of Japan

[73] Assignee: Matsushita Electric Industrial Co., Ltd., Osaka, Japan

[21] Appl. No.: 76,549

[22] Filed: Jul. 22, 1987

[30] Foreign Application Priority Data

Jul. 22, 1986 [JP] Japan .................. 61-172005
Jul. 22, 1986 [JP] Japan .................. 61-172008
Jul. 22, 1986 [JP] Japan .................. 61-172016
Oct. 9, 1986 [JP] Japan .................. 61-240335
Nov. 14, 1986 [JP] Japan .................. 61-272505

[51] Int. Cl.$^4$ ............................................. H01L 33/00
[52] U.S. Cl. ............................................. 357/17; 357/4
[58] Field of Search ................. 357/4, 4 SL, 17, 30

[56] References Cited
U.S. PATENT DOCUMENTS
4,525,687 6/1985 Chemla ................................. 357/4

OTHER PUBLICATIONS
Kobayashi et al., *Appl. Phys. Lett.*, 48, 12 Jan. 1986, pp. 296–297.

Primary Examiner—Martin H. Edlow
Attorney, Agent, or Firm—Wenderoth, Lind & Ponack

[57] ABSTRACT

A semiconductor device in which a strained-layer of super-lattice composed of two or more group II–IV semiconductors grown on an epitaxial growth layer formed on a surface of a semiconductor substrate. Since the strained-layer of super-lattice composed of two or more group II–VI semiconductors is present in the heterojunction of the heterostructure, it is possible to form a favorable heterostructure seminconductor layer, inhibiting the adverse effects of lattice mismatch.

13 Claims, 12 Drawing Sheets

SEMICONDUCTOR DEVICE

BACKGROUND OF THE INVENTION

This invention relates to a semiconductor device which is composed of a heterostructure of dissimilar materials.

Development of a laser diode (LD) or light-emitting diode (LED) emitting the visible light, especially around 400 nm, is presently desired, and recent attention is directed to the II–IV group compounds such as ZnSe and ZnS possessing a band gap of 2.6 eV or more. In these materials, however, it is extremely difficult to form a p-n junction which is necessary for fabricating a diode.

To solve this problem, a second harmonic generator (SHG) using them is now being given considerable attention. Generally, the Group II–VI compound semiconductors exhibitor strong nonlinear optical effect, and have an absorption edge in the short wavelength region, so that they are of outstanding promise as a material for SHG emitting laser light of blue color or an even shorter wavelength. Since this SHG device is not composed of a p-n junction which was absolutely required in the conventional LD fabrication, it is possible to easily obtain an SHG device consisting of Group II–VI compounds.

FIG. 1 shows a structural sectional view of an SHG device using the conventional Group II–VI compound semiconductor the inventors had proposed. Numeral 11 is a GaAs substrate, 12 and 12' are Zns films which are cladding layers for confining light, and 13 is a $ZnS_{0.5}Se_{0.5}$ film which is a waveguiding layer. The film thickness of the waveguiding layer 13 is 0.5 $\mu$m, and that of cladding layers 12, 12' are 2 $\mu$m. The optical waveguide length is 15 mm. As the laser light source, GaAs/AlGaAs DH laser is used, and laser light with wavelength of $\lambda = 0.83$ $\mu$m is coupled from one end of the waveguiding layer 13, and is propagated through the optical waveguide. As the laser light propagates through the waveguiding layer 13, second harmonic waves are generated by the nonlinear optical effect of $Zn_{0.5}Se_{0.5}$, and a laser light of $\lambda = 0.42$ $\mu$m is delivered from the end of the opposite side.

Generally, when forming an optical waveguide, a heterostructure composed of a waveguiding layer and cladding layers having a lower refractive index than the waveguiding layer is employed, and it is possible to confine the light within the waveguiding layer. However, to form an optical waveguide from Group II–VI compound semiconductors, especially to form an optical waveguide for passing light around 400 nm, the materials are limited, and Group II–VI materials different in lattice constant must be grown sequentially. In particular, in the Group II–VI compound semiconductor hetero-junction of the prior art stated above, the lattice mismatch may amount even to several percent, which may seriously affect the characteristics of the device using such materials.

When multi-layers composed of dissimilar materials differing in lattice constant are grown, defects such as misfit dislocation occur due to the lattice mismatch, and they may proliferate to lower the crystallinity. Furthermore, by these defects, diffusion of impurities into the crystals is promoted, and crystals of high purity may not be obtained. Accordingly, absorption of the light to be guided occurs, which may lead to increase of the loss of light propagation. Still further, by the lattice mismatch, the morphology of the hetero-interface or surface is worsened, and the scattering loss of waveguiding layer increases.

Incidentally, as a combination for lattice matching with a GaAs substrate, ZnSSe and ZnCdS are known, however ZnCdS has a wurtzite crystal structure which is undesirable in a high quality ZnS crystal.

In the prior art explained herein, GaAs was used as the substrate, but at the present, the GaAs substrate is very expensive, and Ga and As are very toxic. Nevertheless, many problems are left unsolved for epitaxial growth of Group II–VI compound semiconductor of high quality on an inexpensive and less toxic Si substrate.

Generally, since Si is not a compound, its binding power with a compound having a polarity in crystal structure is weak, and when a compound is directly grown on a Si substrate by epitaxial growth, the adhesion of the growth layer on the substrate is very poor. On the other hand, when a compound is formed on an $SiO_2$ substrate by epitaxial growth, the adhesion to the substrate is very good, but the obtained growth layer is polycrystalline.

It was hence impossible to grow Group II–VI compounds of sufficiently high quality so as to be applied in a device on a Si substrate by epitaxial growth.

SUMMARY OF THE INVENTION

It is a hence a primary object of this invention to present a semiconductor device having a heterostructure excellent in surface morphology and low in dislocation density, by inhibiting the occurrence or multiplication of dislocation due to misfit strain, in heteroepitaxial growth of materials having lattice mismatch with each other.

It is another object of this invention to realize a heterostructure by forming a cladding layer of a Group II–VI compound semiconductor on a semiconductor substrate by, for example, metalorganic vapor phase epitaxy, forming a strained layer super-lattice composed of two or more Group II–VI compound semiconductors thereon, and using this strained layer super-lattice as an optical waveguiding layer.

It is a different object of this invention to realize a heterostructure in which a cladding layer of the Group II–VI compound semiconductor is formed on a semiconductor layer, and a strained layer super-lattice composed of two or more Group II–VI compound semiconductors is formed thereon, and then a waveguiding layer is formed.

It is a further and different object of this invention to realize a heterostructure by forming an epitaxial growth layer on a strained layer super-lattice, the period of which varies gradually from the substrate side, or, if the period is constant, the layer thickness of each material to compose it varies gradually.

It is a still another object of this invention to realize a heterostructure by forming a strained layer super-lattice composed of two or more Group II–VI compound semiconductors on a insulation film formed on a semiconductor substrate, and then forming a Group II–VI compound semiconductor thereon.

It is a still different object of this invention to realize a heterostructure by forming a strained layer super-lattice composed of two or more Group II–VI compound semiconductors on a semiconductor substrate possessing a part coated with an insulation film and an exposed part, and then forming a Group II-VI compound semiconductor on this layer.

According to the present invention as described herein, the following benefits, among others, are obtained.

This invention makes it possible to realize a nonlinear optical device of extremely high efficiency, by restricting the adverse effect of lattice mismatch, which was one of the problems of hetero-junction device possessing heterostructure, and further enhancing the nonlinear optical effect by, for example, forming an optical waveguide of extremely low loss of light propagation.

Furthermore, according to this invention, by increasing the adhesion to the substrate, which was one of the problems of epitaxial growth of Group II-VI compounds on a Si substrate, and also by inhibiting the adverse effect of lattice mismatch, it becomes possible to form a single crystal epitaxial film with an extremely high quality, and it becomes possible to fabricate a Group II-VI compound hetero-junction device on Si substrate.

While the novel features of the invention are set forth with particularly in the appended claims, the invention, both as to organization and content, the invention will be better understood and appreciated, along with other objects and features thereof, from the following detailed description taken in conjunction with the drawings.

DETAILED DESCRIPTION OF THE INVENTION

Figure 2:
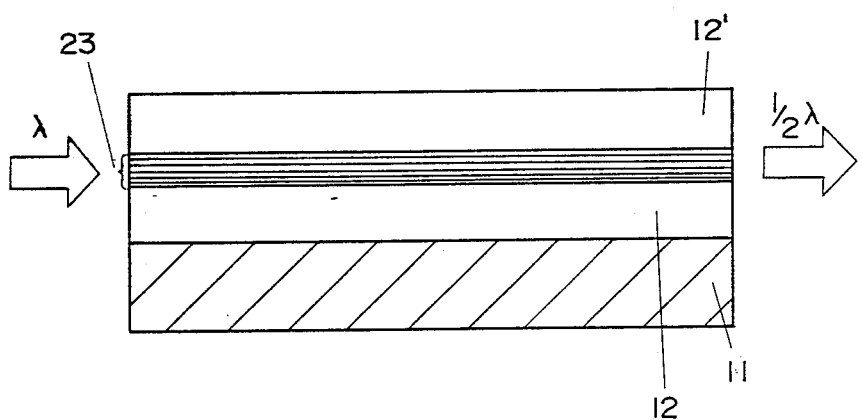
FIG. 2 is a sectional view of an SHG device in a first embodiment of this invention.

FIG. 2 shows a sectional view of an optical waveguide according to a first embodiment of this invention. In FIG. 2, numeral 11 is a GaAs substrate, 12 and 12' are ZnS films which are cladding layers for confining light, and 23 is a strained layer super-lattice composed of a multilayer structure of $ZnS_{0.5}Se_{0.5}$ and ZnS which is a waveguiding layer. The film thickness of cladding layers 12, 12' is 2 μm. In the strained layer super-lattice 23, the film thickness of $ZnS_{0.5}Se_{0.5}$ is 100Å and the film thickness of ZnS is 100Å, and they are grown sequentially and alternately in 10 periods. The optical waveguide length is 15 mm.

The method of fabricating this device is as follows. In this embodiment, metal organic vapor phase epitaxy (MOVPE) is used as the method of epitaxial growth, but the same effects will be obtained by employing other methods, such as molecular beam epitaxy (MBE) and hot wall epitaxy. To pretreat the substrate, the GaAs (100) substrate 11 is etched in a sulfuric acid etchant of $H_2SO_4:H_2O_2:H_2O=5:1:1$ for 90 seconds. Afterwards, in the reactor tube, it is thermally etched in $H_2$ flow (2 liters/min) for 20 minutes at about 600° C. Subsequently, epitaxial layers are sequentially grown on the substrate by the MOVPE method.

In this embodiment, meanwhile, dimethyl zinc (DMZ), dimethyl selenium (DMSe), and dimethyl sulfur (DMS) were used as source materials, but it is also possible to use, as Group VI materials, diethyl selenium (DESe), hydrogen selenide ($H_2Se$), diethyl sulfur (DES), hydrogen sulfide ($H_2S$) or others. The growth condition may considerably depend on the MOVPE equipment, but the conditions used here should be, for example, $H_2$ flow of DMZ (0° C.)=2.5 cc/min, and $H_2$ flow of DMS (0° C.)=9 cc/min in the case of ZnS growth, or $H_2$ flow of DMZ (0° C.)=2.5 cc/min, $H_2$ flow of DMSe (15° C.)=3 cc/min, and $H_2$ flow of DMS (0° C.)=9 cc/min in the case of $ZnS_{0.5}Se_{0.5}$ growth, and the total $H_2$ flow is 1.5 liters/min, and the working pressure is kept at 100 Torr or less.

In the above conditions, first of all, a first ZnS cladding layer 12 is formed on (100) GaAs substrate, and ZnSSe and ZnS are alternately grown in 10 periods by 100 Å each thereon to fabricate a strain super-lattice layer 23. And a second ZnS cladding layer 12' is formed thereon.

Figure 1:
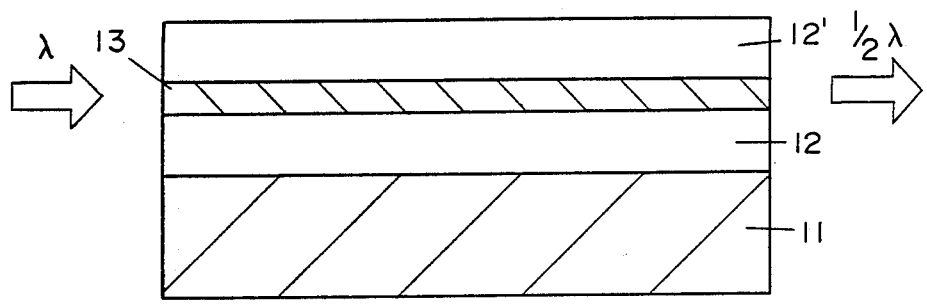
FIG. 1 is a sectional view of an SHG device using a conventional Group II-VI compound semiconductor.

According to this method it is possible to form a waveguiding layer 23 composed of the heterostructure possessing an extremely favorable surface morphology, and the light propagation loss, which could be achieved only to about $\alpha \approx 50$ cm$^{-1}$ in the prior art shown in FIG. 1, was extremely low, that is, $\alpha < 0.5$ cm$^{-1}$ ($\lambda = 420$ μm) in the embodiment shown in FIG. 2. Furthermore, since the anisotropy of electric polarization is enhanced by the misfit stress of the strained layer super-lattice, the effective nonlinear optical constant of the optical waveguide was a very high value of $1.0 \times 10^{-10}$ m/v.

In the explanation herein, $ZnS_{0.5}Se_{0.5}$ and ZnS were used as the materials for strained layer super-lattice, and they may be respectively replaced by ZnSe and ZnS, ZnSe and ZnSSe, ZnTe and ZnSe, ZnTe and ZnSeTe, etc., and the composition of alloy may be also different from X=0.5. Besides, the cladding layer may not be necessarily same as in this composition, and those smaller than the waveguiding layer in the refractive index may be selected, such as ZnSe, ZnSSe, and ZnSeTe. Similarly, the film thickness of each layer and period of strained layer super-lattice may be properly selected.

Or by varying the well layer thickness in the quantum well structure, the effective band gap may be controlled, and the absorption edge may be easily controlled as desired.

Figure 3:
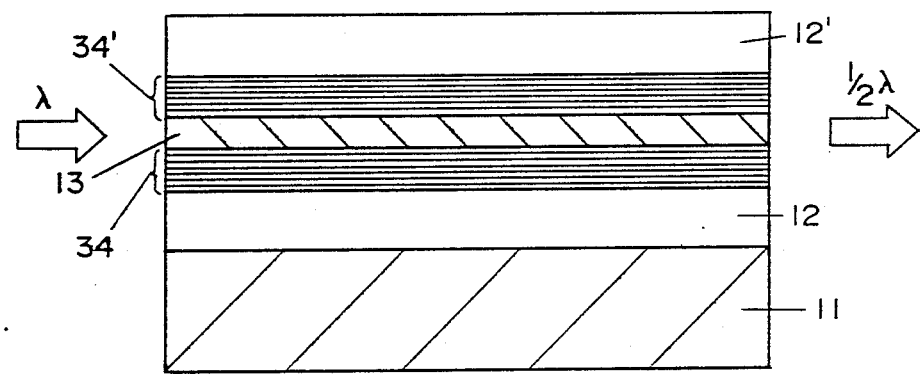
FIG. 3 is a sectional view of an SHG device in a second embodiment of this invention.

FIG. 3 shows a structural sectional view of an optical guide according to a second embodiment of this invention. In FIG. 3, numeral 11 is a GaAs substrate, 12 and 12' are ZnS films which are cladding layers for confining light, 13 is a ZnS$_{0.5}$Se$_{0.5}$ film which is a waveguiding layer, and 34 and 34' are strained layer super-lattice of ZnS and ZnS$_{0.5}$Se$_{0.5}$. The film thickness of waveguiding layer 13 is 0.5 μm, and that of cladding layers 12, 12' is 2 μm. The film thickness of strained layer super-lattice 34, 34' is 100 Å for the ZnS and 100 Å for the ZnS$_{0.5}$Se$_{0.5}$, which are sequentially and alternately grown in 10 periods. The optical waveguide length is 15 mm.

Figure 4:
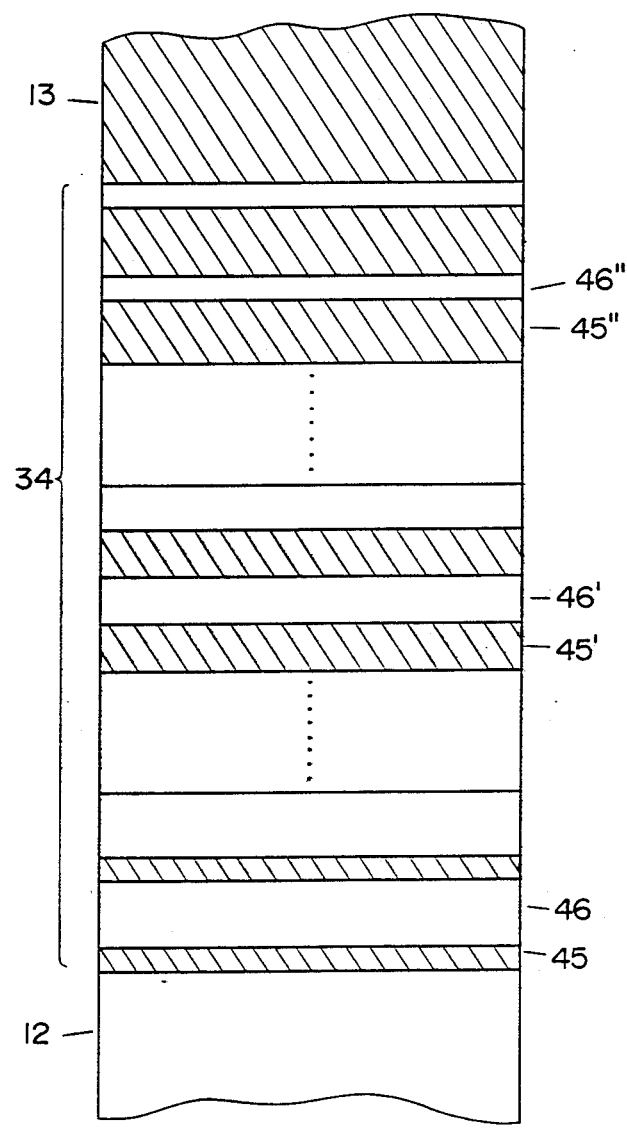
FIG. 4 is a sectional view of a second strained layer super-lattice composing the second embodiment of this invention.

Meanwhile, as the materials for strained layer super-lattice layers 34 and 34', it is possible to use those of which thickness varies gradually from the substrate side. For example, as shown in FIG. 4, the effect as buffer layer is further enhanced by using the strained layer super-lattice 34 consisting of, sequentially from the ZnS side, 10 pairs of ZnS(80Å)—ZnSSe(20Å), 10 pairs of ZnS(50A)—ZnSSe(50A), and another 10 pairs of ZnS(20A)—ZenSSe(80A). In the case of strained layer super-lattice 34', the above structure is turned upside down 45, 45' and 45" are ZnSSe layers, and 46, 46' and 46" are ZnS layers.

Figure 5:
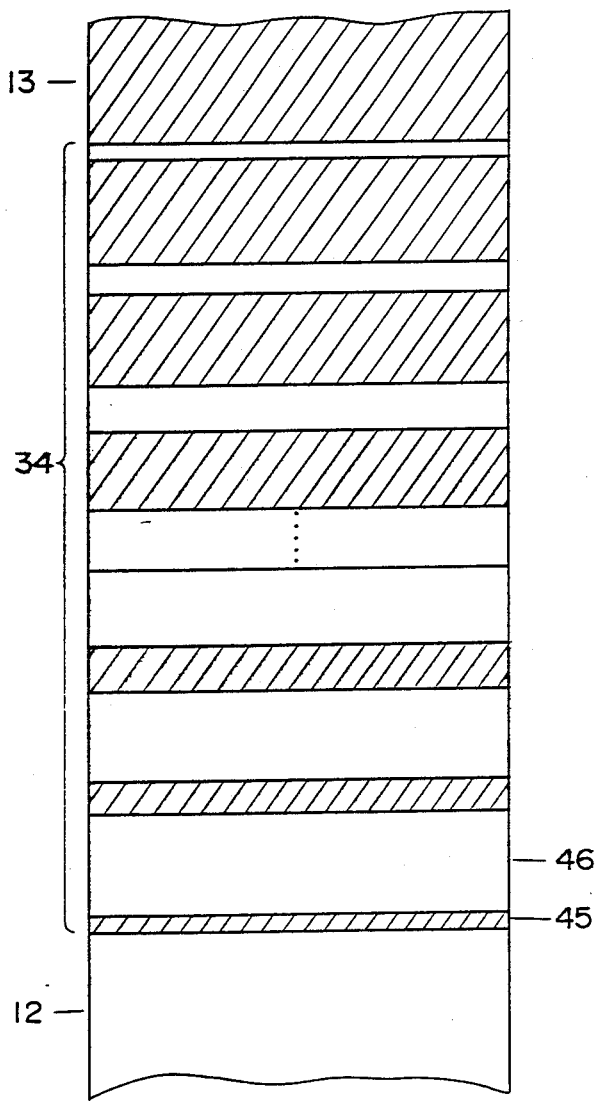
FIG. 5 is a sectional view of a third strained layer super-lattice composing the second embodiment of this invention.
Figure 6:
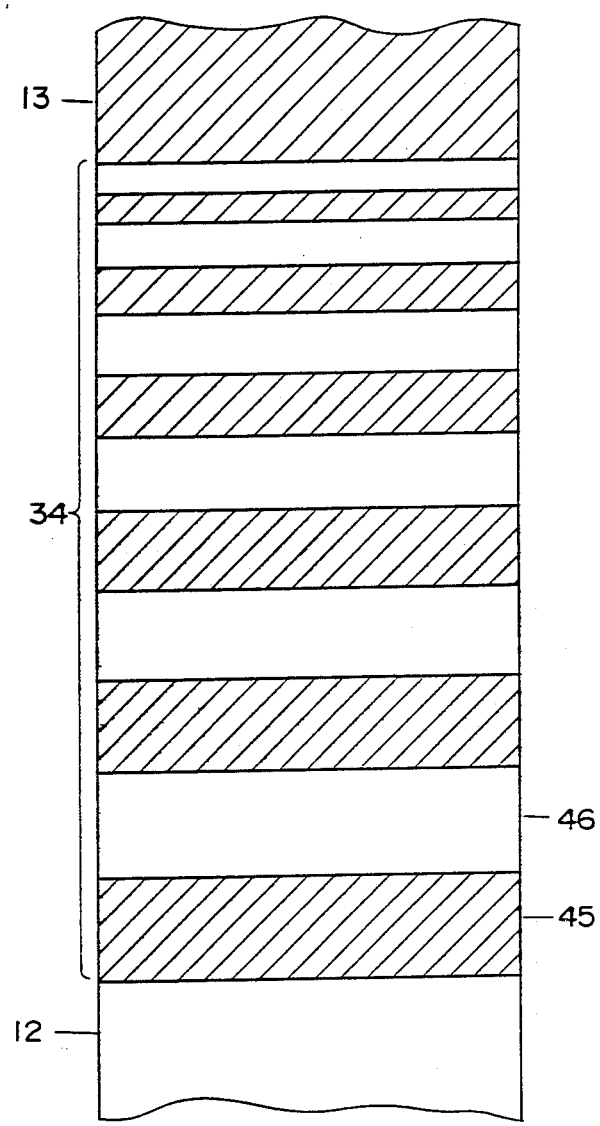
FIG. 6 is a sectional view of a fourth strained layer super-lattice composing the second embodiment of this invention.

Furthermore, either the period may be constant with the layer thickness of each constituent material varying gradually in each pair from the substrate side as shown in FIG. 5, or the period may vary gradually from the substrate side as shown in FIG. 6.

Thus, by placing a strained layer super-lattice 34 between the waveguiding layer 13 and cladding layer 12 as a buffer layer, the lattice mismatch is relaxed, and the occurrence or multiplication of defects such as misfit dislocation may be inhibited. Besides, the surface morphology of the optical waveguide will be extremely excellent.

In the above explanation, ZnS$_{0.5}$Se$_{0.5}$ and ZnS were used as the waveguiding layer and cladding layer, but they may be respectively replaced by ZnSe and ZnS, ZnSe and ZnSSe, ZnTe and ZnSe, ZeTe and ZnSeTe, etc., and the composition of the alloy may be also different from X=0.5. Besides, the strained layer super-lattice is not limited to the shown composition, and ZnSe and ZnS, ZnSe and ZnSSE alloy, ZnTe and ZnSe, ZnTe and ZnSeTe alloy, or combination of these alloy semiconductors may be used to compose the strained layer super-lattice, and the film thickness of each layer or period may be optimally selected.

As the substrate, in this embodiment, a GaAs substrate was used, but other substrates such as Si and InP may be also used. Meanwhile, if the crystallinity of the cladding layer is inferior due to, for example, large lattice-mismatch between the semiconductor substrate and epitaxial layer (the cladding layer in this embodiment), it may be also necessary, needless to say, to apply a strained layer super-lattice also between these layers.

It is further possible to form a nonlinear optical device on a GaAs substrate, on which a device such as semiconductor laser is preliminarily formed, thereby producing a monolithically integrated device of a nonlinear optical device and a semiconductor laser or the like. Since the growth temperature of Group II-VI semiconductors by MOVPE or MBE is generally low, thermal degradation or other problems do not occur at all if growth occurs on the substrate on which the semiconductor laser or the like is formed.

Figure 7:
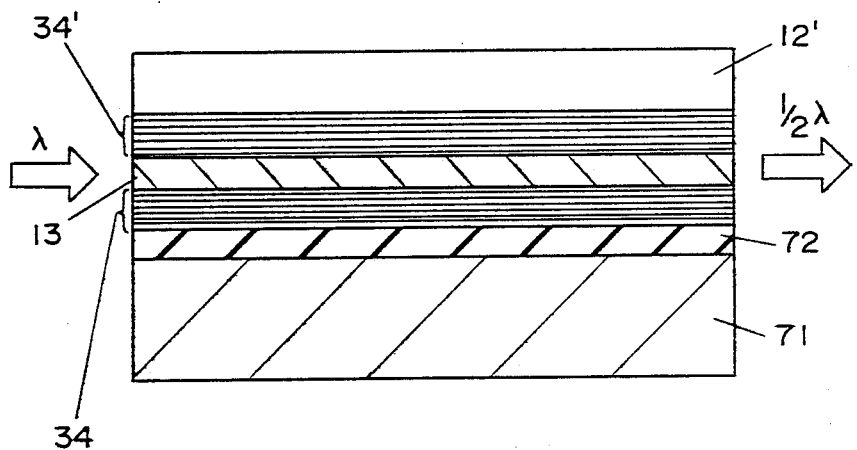
FIG. 7 is a sectional view of an SHG device in a third embodiment of this invention.

Referring now to FIG. 7 showing the structural sectional view of an optical waveguide, a third embodiment of this invention is described below. In FIG. 7, numeral 71 is a Si substrate, 72 is an SiO$_2$ thermal oxidation film, 13 is a ZnS$_{0.5}$Se$_{0.5}$ film which is a waveguiding layer, 34 and 34' are strained layer super-lattice of ZnS and ZnS$_{0.5}$Se$_{0.5}$, and 12' is a ZnS film which is a cladding layer for confining light. The film thickness of the waveguiding layer 13 is 0.5 μm, and that of cladding layer 12' is 2 μm. The strained layer super-lattice 34 and 34' have 100 Å thick ZnS and 100 Å thick ZnS$_{0.5}$Se$_{0.5}$, which are alternately and sequentially grown in 10 periods. The film thickness of SiO$_2$ thermal oxidation film 72 is 1 μm. The optical waveguide length is 15 mm.

This method enables the formation of a heterostructure possessing an extremely excellent surface morphology, and the light propagation loss is extremely low, that is $\alpha < 0.9$ cm$^{-1}$ ($\lambda = 420$ nm).

In the above description, a Si substrate was used, but GaAs, InP or others may be also used, and SiN$_4$ or the like may be also usable as an insulation film. As the waveguiding layer and cladding layer, ZnS$_{0.5}$Se$_{0.5}$ and ZnS were used, which may be also replaced by combinations of ZnSe and ZnS, ZnSe and ZnSSe, ZnTe and ZnSe, ZnTe and ZnSeTe, etc., and the composition of alloy may be other than X=0.5. The strained layer super-lattice may be also different from the shown composition, and strained layer super-lattices of ZnSe and ZnS, ZnSe and ZnSSe, ZnTe and ZnSe, ZnTe and ZnSeTe, or others may be also applicable.

Figure 8:
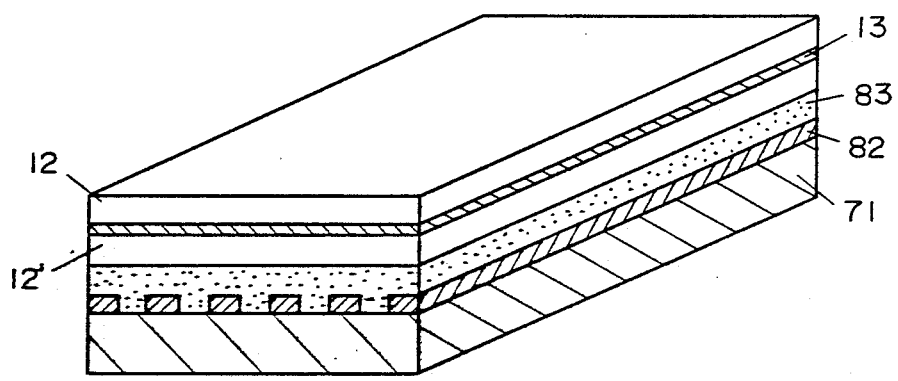
FIG. 8 is a sectional view of an SHG device in a fourth embodiment of this invention.

Incidentally, in the third embodiment, the SiO$_2$ thermal oxidation film 72 may be patterned. In FIG. 8, numeral 71 is a Si substrate, 82 is a patterned SiO$_2$ thermal oxidation film, 83 is a strained layer super-lattice of ZnS and ZnS$_{0.9}$Se$_{0.1}$, 12 and 12' are ZnS single crystal layers which are cladding layers for confining light, and 13 is a ZnS$_{0.5}$Se$_{0.5}$ single crystal layer which is a waveguiding layer.

The film thickness of waveguiding layer 13 is 0.5 μm, and that of cladding layers 12 and 12' are 2 μm. The strained layer super-lattice 83 has 100 Å thick ZnS and 100 Å thick ZnS$_{0.9}$Se$_{0.1}$, which are sequentially and alternately grown in 10 periods. The film thickness of SiO$_2$ thermal oxidation film 82 is 0.2 μm, and the stripe width is 3 μm and the interval is 8 μm. The optical waveguide length is 15 mm.

By this method, it is possible to form a heterostructure having an extremely excellent surface morphology, and the light propagation loos is extremely low, that is $\alpha < 1.0$ cm$^{-1}$ ($\lambda g = 420$ nm). Warping of substrate was hardly observed.

Besides, by optimizing the height, width and interval of SiO$_2$ stripes 82, it is also possible to confine the light laterally, and the efficiency of SHG seems to be enhanced.

In the above explanation, an Si substrate was used, but GaAs, InP, or others may be used, and SiN$_4$ or the like may be used as insulation film.

In addition it is also possible to form a nonlinear optical device as a monolithicically integrated device of nonlinear optical device and semiconductor laser or VLSI or the like, on a Si substrate on which these devices are preliminarily formed.

Thus, by forming a strained layer super-lattice on a semiconductor substrate having a part covered with an insulation film and an exposed part, the adhesion of the strained layer super-lattice on the insulation film is increased, and the background of the single crystal epitaxial growth is formed by the strained layer super-lattice on the exposed semiconductor substrate. Or the lattice mismatch is relaxed by the strained layer super-lattice, and occurrence or multiplication of defects such as misfit dislocation may be inhibited, while the problem of warp of the substrate due to lattice mismatch may be alleviated by the growth layer on the insulation film.

Figure 9:
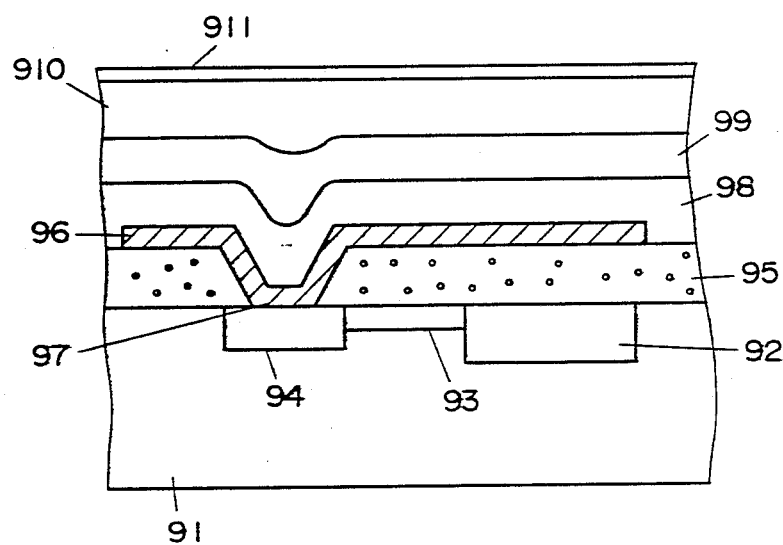
FIG. 9 is a sectional view of a laminate type CCD image sensor fabricated according to the fourth embodiment of this invention.

Another example of the application of the embodiment shown in FIG. 8 is illustrated in FIG. 9, which shows the outline of the partial section of a laminate type CCD image sensor.

On a p-type Si substrate 91, a buried type CCD scanning circuit 92 is formed. Numeral 93 is a gate, which is intended to sweep out the signal in the signal accumulation layer 94 into the CCD scanning circuit 92. Incidentally, the driving electrodes for CCD scanning circuit 92 and gate 93 are not shown in the drawing. Numeral 95 is an $SiO_2$ as interlayer insulation film, and Mo electrode 96 and signal accumulation layer 94 are connected with each other through a contact hole 97. Conventionally, the Mo electrode 96 was patterned in the specified area on this $SiO_2$ 95, and ZnSe and ZnCdTe were deposited thereon by vacuum deposition process. In this invention, on the other hand, 10 pairs of strained layer super-lattice 98 of about 100 Å of ZnTe and CdTe are formed in the first place by the MOVPE method. The forming conditions are, for a growth temperature of 350° C., growth pressure of 100 Torr, and carrier gas $H_2$ flow of 4 liters/min, and organic metals to be supplied are DMZ, DMSe, DMCd or the like. A favorable strained layer super-lattice 98 may be easily formed also on the $SiO_2$ or metals according to the MOVPE method, and after the background of single crystal epitaxial film is formed, the single crystals ZnCdTe 99 and ZnSe 910 are continuously developed by epitaxial growth. Finally, as a voltage application terminal, an ITO (indium tin oxide) 911 transparent to visible light is formed by other vacuum deposition method or the like.

According to this embodiment, since the ZnSe/ZnCdTe hetero-junction film as photoelectric conversion film is made of a different single crystal epitaxial film from the prior art, it possesses an excellent photo detecting function. Besides, since the surface is mirror-smooth, it is dried quickly after washing in water or organic solution, and the Si cleaning process may be easily applied.

This embodiment related to the ZnTe/CdTe strained layer super-lattice structure on the CCD integrated circuit formed on the Si substrate, but the material of strained layer super-lattice may be different if the purpose is not same. Needless to say, the optimum conditions must be established by varying the layer thickness of the strained layer super-lattice or the number of pairs, depending on the type of the insulator in the background or the type or shape of step of metals. The background is not limited to Si, but GaAs, InP or other III–V compound semiconductors may be used. Anyway, the process of III–V is in a temperature range of 600° to 900° C., and the Si process, about 900° to 1150° C., and it is a great advantage in fabrication of a three-dimensional device, that the preliminarily formed Si circuit or III–V circuit is almost free from the effect of heat process for formation of II–VI strained layer super-lattice or the like to be laminated thereon.

Above is described an example of a device with a structure using the strained layer super-lattice structure of a group II–VI semiconductor as buffer layer. As an example of this effect, below, a combination of ZnSe and ZnS, which are both very high in lattice mismatch ($\approx 5\%$), is stated below with respect to the result of evaluation of the effect.

Figure 10:
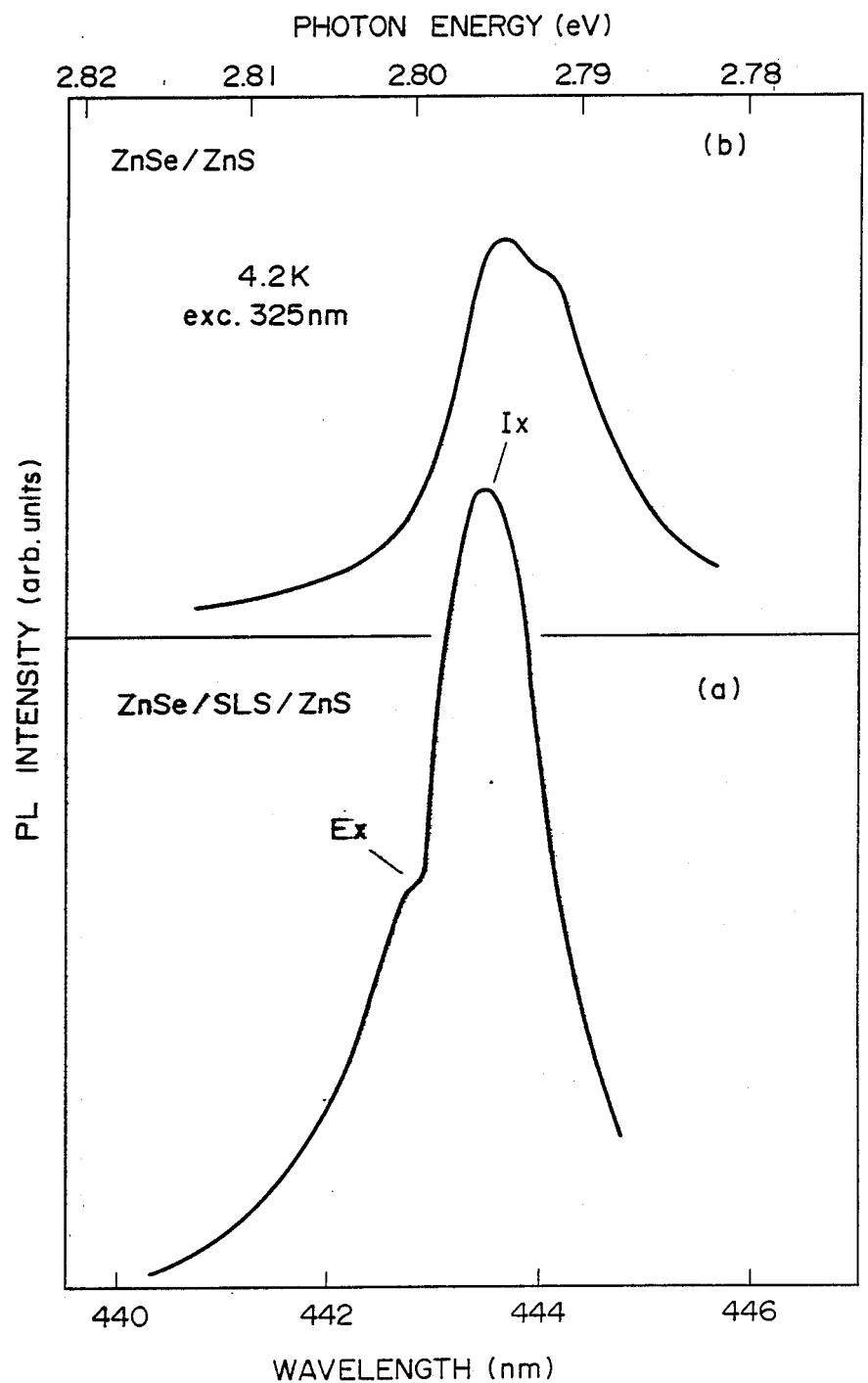
FIG. 10 is a photoluminescence spectra at 4.2k of ZnSe layer fabricated according to the second embodiment of this invention.

FIG. 10 shows the result of measurement of photoluminescence at 4.2k. FIG. 10 (a) records the photoluminescence spectra from the ZnSe layer when ZnSe layer (0.6 μm) is grown after a strained layer super-lattice of 10 period of ZnSe (20Å)−ZnS(20Å) is grown on ZnS as buffer layer. On the other hand, FIG. 10(b) indicates photoluminescence spectra from the ZnSe layer when ZnSe layer (0.6 μm) is directly grown on the ZnS. When ZnSe layer is grown directly, the photoluminescence of the exciton bound by the neutral donor is predominant, but when the strained layer super-lattice is used as the buffer layer, an intense photoluminescence (2,800 eV) by free exciton is observed, which shows that the crystallinity is improved.

Figure 11:
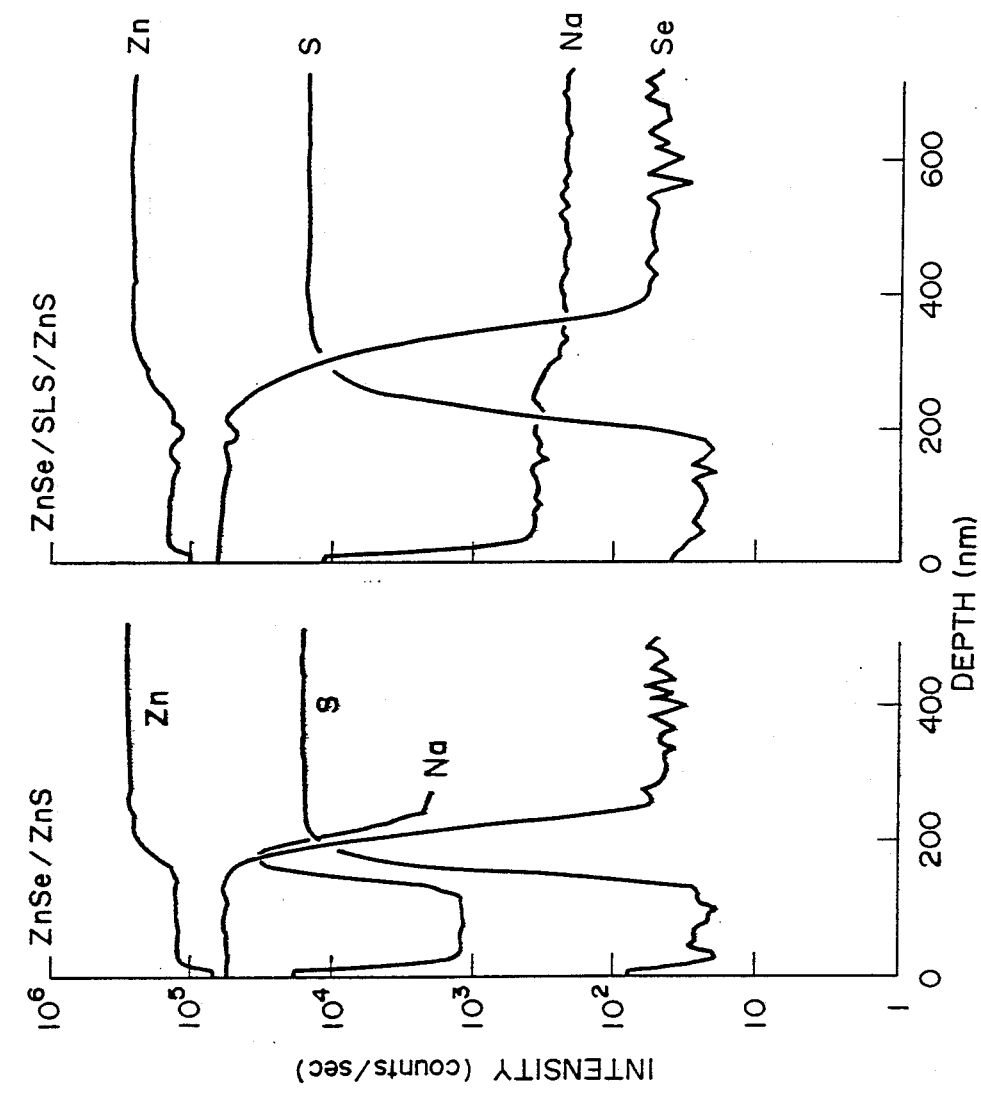
FIG. 11 shows an SIMS profile of ZnSe/ZnS heterostructure fabricated according to the second embodiment of this invention.
Figure 12:
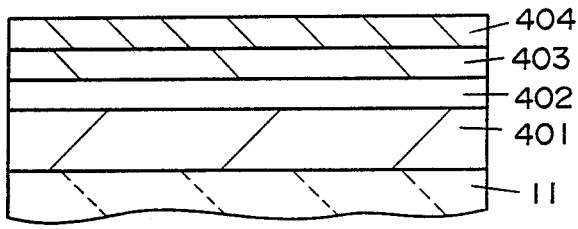
FIG. 12 shows a manufacturing process of a monolithically integrated device of SHG device and AlGaAs/GaAs semiconductor laser according to the first embodiment of this invention.
Figure 12:
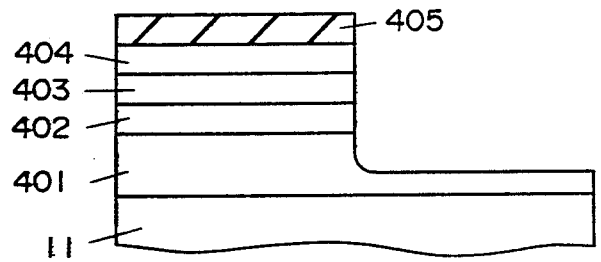
Figure 12:
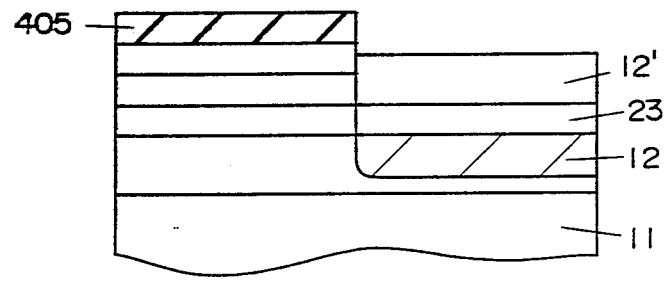
Figure 12:
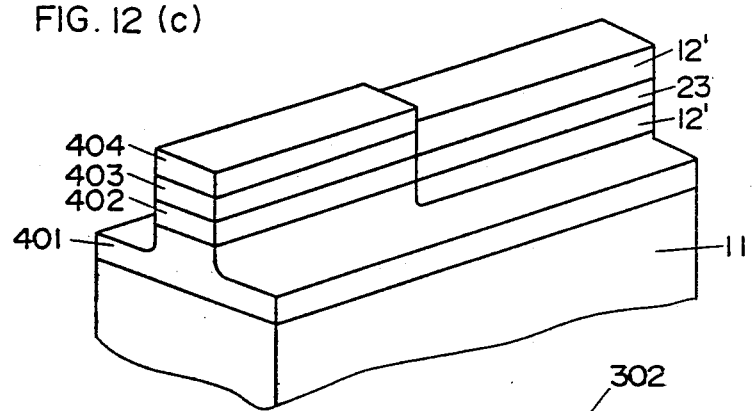
Figure 12:
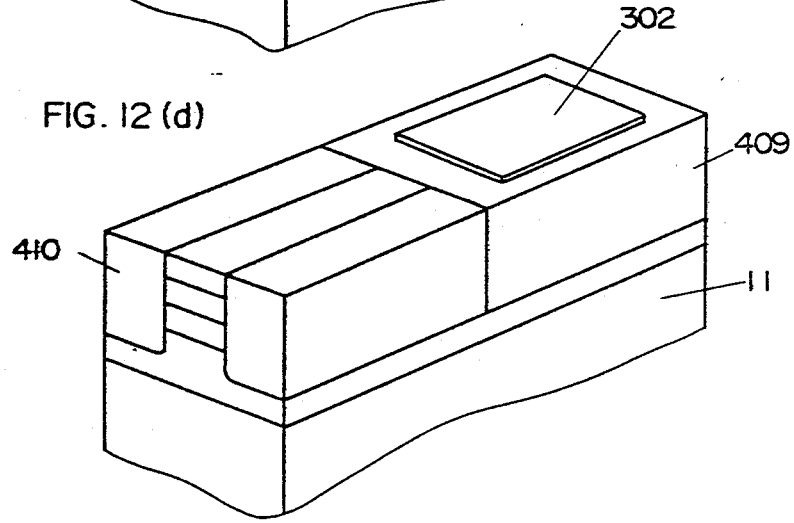

FIG. 11 shows the result of measurement of secondary ion mass spectroscopy. FIG. 11 (a) refers to the depth profile of the elements by direct growth of ZnSe on ZnS, while FIG. 11 (b) relates to the elements in which the 10 periods of strained layer super-lattice of ZnSe (20Å)−ZnS(20Å) are used as a buffer layer. In the case of direct growth on the ZnS, impurities such as Na are piled up near the ZnSe/ZnS hetero-interface. On the other hand, when the strained layer super-lattice is used as buffer layer, such pile-up of impurities is not observed, and it is considered that the defects to trap the impurities are decreased.

Below is mentioned an example of a method of fabrication of a monolithic device of an SHG device and semiconductor layer in the first embodiment of this invention. On an n-type (100) GaAs substrate 11, a first cladding layer 401 of an n-type $Al_xGa_{1-x}As$ (x=0.3), an active layer 402 of an n-type GaAs, a second cladding layer 403 of a p-type $Al_yGa_{1-y}As$ (y=0.3), and a contact layer 404 of p+ type GaAs were sequentially grown by liquid phase epitaxy (LPE). Then, by etching until reaching the first cladding layer 401 by the dry etching technique, using an $SiO_2$, photoresist or the like as mask material 504, one half side of each growth layer 401 to 404 was removed. The surface direction of the step part formed at this time was set at (011). On this one half side, a third cladding layer 12 of ZnS, a waveguiding layer 23 which is a strained layer super-lattice composed of $ZnS_{0.5}Se_{0.5}$ and ZnS in a multilayer structure, and a fourth cladding layer 12' of ZnS were sequentially grown by the MOVPE method. Incidentally, this strained layer super-lattice 23 is an alternate multilayer of $ZnS_{0.5}Se_{0.5}$ Å and ZnS 100 Å in 10 periods. This growth was controlled so that the height of the boundary of the active layer 402 and second cladding layer 403 from the substrate 11, and that of the boundary of optical waveguide 23 and fourth cladding layer 12' from the substrate 11 might be equal to each other. Then, removing said $SiO_2$ 405, and after newly forming an $SiO_2$ stripe extending in the direction of (011), it is used as the mask material to etch to a depth reaching part of the first cladding layer 401, and stripes of optical waveguide were formed in the laser part and SHG. Furthermore, after forming an $SiO_2$ 409 in said SHG and optical waveguide, in part of the laser part from which crystals were removed by etching, a buried layer 410 was newly formed from the high resistance AlGaAs. Meanwhile, the metal electrode 302 on the SHG was selectively formed by the known methods of vacuum deposition and etching.

In this embodiment, incidentally, the first embodiment was used as the structure of an SHG device, but it is evident that the second embodiment can be employed similarly.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

We claim:

1. A semiconductor device which is a second harmonic generator comprising a strained layer superlattice which is composed of a multilayer structure made of first and second Group II-VI semiconductors, said first and second Group II-VI semiconductors having first and second lattice constants respectively and formed on a semiconductor substrate, wherein when a first optical wave is incident on said strained layer for propagation in said strained layer, a second harmonic wave of a wavelength shorter than said first optical wave is generated by a nonlinear optical effect therein.

2. The semiconductor device according to claim 1, wherein said strained layer superlattice is grown on a semiconductor layer formed on the surface of said semiconductor substrate.

3. The semiconductor device according to claim 2, wherein the refractive index of said strained layer superlattice is greater than the refractive index of said semiconductor layer.

4. The semiconductor device according to claim 1, further comprising a second semiconductor device formed on said semiconductor substrate in advance of formation of said strained layer superlattice.

5. The semiconductor device according to claim 1, wherein said first and second Group II-VI semiconductors are ZnSSe and ZnS, ZnSe and ZnS or ZnSe and ZnSSe.

6. The semiconductor device according to claim 2, wherein said strained layer superlattice is positioned between first semiconductor formed on said surface of semiconductor substrate and a second semiconductor, each having respective first and second lattice constants.

7. The semiconductor device according to claim 6, wherein the refractive index of said second semiconductor layer is greater than the refractive index of said first semiconductor layer.

8. The semiconductor device according to claim 1, wherein said strained layer superlattice is grown on an insulation film formed on the surface of said semiconductor substrate.

9. The semiconductor device according to claim 8, wherein said insulation film consists of $SiO_2$.

10. The semiconductor device according to claim 8, wherein the refractive index of said strained layer superlattice is greater than the refractive index of said insulation film.

11. The semiconductor device according to claim 8, wherein said strained layer superlattice is positioned between said insulation film formed on said surface of semiconductor substrate and a semiconductor layer.

12. The semiconductor device according to claim 1, wherein said strained layer superlattice is grown on said surface of semiconductor substrate possessing a part coated with an insulation film and an exposed part.

13. The semiconductor device according to claim 12, wherein said insulation film consists of $SiO_2$.

* * * * *